(12) United States Patent
Vincent et al.

(10) Patent No.: US 11,631,625 B2
(45) Date of Patent: Apr. 18, 2023

(54) TOPSIDE HEATSINKING ANTENNA LAUNCHER FOR AN INTEGRATED CIRCUIT PACKAGE

(71) Applicant: NXP USA, Inc., Austin, TX (US)

(72) Inventors: Michael B. Vincent, Chandler, AZ (US); Antonius Johannes Matheus de Graauw, Haelen (NL); Giorgio Carluccio, Eindhoven (NL); Waqas Hassan Syed, Eindhoven (NL); Maristella Spella, Eindhoven (NL)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/820,300

(22) Filed: Aug. 17, 2022

(65) Prior Publication Data
US 2022/0392821 A1    Dec. 8, 2022

Related U.S. Application Data

(62) Division of application No. 16/716,720, filed on Dec. 17, 2019.

(51) Int. Cl.
*H01L 23/367*    (2006.01)
*H01L 21/48*    (2006.01)
*H01P 1/26*    (2006.01)

(52) U.S. Cl.
CPC ...... *H01L 23/3672* (2013.01); *H01L 21/4882* (2013.01); *H01P 1/264* (2013.01)

(58) Field of Classification Search
CPC ............. H01L 21/4882; H01L 23/3672; H01L 23/166; H01L 23/5389; H01L 2223/6627; H01L 2223/6677; H01P 1/262; H01P 1/264; H01P 1/30; H01P 3/12; H01P 11/002; H01Q 1/02; H01Q 1/2283; H01Q 21/0006; H01Q 21/005; H01Q 21/064
USPC ......................................... 165/80.3; 257/428
See application file for complete search history.

(56) References Cited

U.S. PATENT DOCUMENTS

| | | |
|---|---|---|
| 6,222,276 B1 | 4/2001 | Bertin et al. |
| 9,219,041 B2 | 12/2015 | Elad et al. |
| 10,103,447 B2 | 10/2018 | Tong et al. |
| 10,141,182 B1 | 11/2018 | Molla et al. |
| 10,485,091 B2 | 11/2019 | Molla et al. |
| 11,276,654 B2 | 3/2022 | Vincent et al. |

(Continued)

OTHER PUBLICATIONS

Non-final office action dated Jan. 6, 2022 in U.S. Appl. No. 16/716,720.

(Continued)

*Primary Examiner* — Len Tran
*Assistant Examiner* — Gustavo A Hincapie Serna

(57) ABSTRACT

A mechanism is provided to remove heat from an integrated circuit (IC) device die by directing heat through a waveguide to a heat sink. The waveguide is mounted on top of a package containing the IC device die. The waveguide is thermally coupled to the IC device die. The waveguide transports the heat to a heat sink coupled to the waveguide and located adjacent to the package on top of a printed circuit board on which the package is mounted. Embodiments provide both thermal dissipation of the generated heat while at the same time maintaining good radio frequency performance of the waveguide.

20 Claims, 3 Drawing Sheets

(56) References Cited

U.S. PATENT DOCUMENTS

| | | | |
|---|---|---|---|
| 2002/0167084 A1* | 11/2002 | Coccioli | H01L 24/49 |
| | | | 257/E23.105 |
| 2003/0062607 A1 | 4/2003 | Grundler | |
| 2004/0150554 A1* | 8/2004 | Stenger | H01Q 3/26 |
| | | | 342/175 |
| 2008/0246562 A1 | 10/2008 | Sherrer et al. | |
| 2010/0084926 A1 | 4/2010 | Bayerer | |
| 2011/0018114 A1 | 1/2011 | Pagaila et al. | |
| 2012/0238042 A1 | 9/2012 | Ossimitz | |
| 2013/0207274 A1 | 8/2013 | Liu et al. | |
| 2013/0256849 A1 | 10/2013 | Danny et al. | |
| 2013/0256850 A1 | 10/2013 | Danny et al. | |
| 2014/0110841 A1 | 4/2014 | Beer et al. | |
| 2014/0264938 A1 | 9/2014 | Hackler, Sr. et al. | |
| 2016/0148902 A1 | 5/2016 | Chen et al. | |
| 2017/0236776 A1* | 8/2017 | Huynh | H01L 23/49822 |
| | | | 438/26 |
| 2019/0109362 A1 | 4/2019 | Haroun et al. | |
| 2019/0348746 A1* | 11/2019 | Gupta | H01L 23/49838 |
| 2020/0185299 A1 | 6/2020 | Chang et al. | |
| 2020/0243464 A1 | 7/2020 | Hsu et al. | |
| 2020/0266132 A1 | 8/2020 | Cho et al. | |
| 2020/0273773 A1 | 8/2020 | Wan et al. | |
| 2020/0344869 A1* | 10/2020 | So | H01L 24/20 |
| 2020/0365544 A1* | 11/2020 | Chen | H01L 23/5383 |
| 2020/0373244 A1* | 11/2020 | Kang | H01L 23/552 |
| 2021/0057346 A1* | 2/2021 | Tsai | H01L 21/4853 |
| 2021/0111134 A1* | 4/2021 | Chang | H01L 23/49833 |
| 2021/0134751 A1* | 5/2021 | Lu | H01L 23/66 |
| 2021/0296207 A1 | 9/2021 | Tobata et al. | |
| 2022/0051997 A1* | 2/2022 | Ichinohe | H01L 23/3107 |

OTHER PUBLICATIONS

Notice of Allowance dated May 23, 2022 in U.S. Appl. No. 16/716,720.

* cited by examiner

TOPSIDE HEATSINKING ANTENNA LAUNCHER FOR AN INTEGRATED CIRCUIT PACKAGE

CROSS-REFERENCE TO RELATED APPLICATIONS

This application is a divisional application of a U.S. patent application entitled "TOPSIDE HEATSINKING ANTENNA LAUNCHER FOR AN INTEGRATED CIRCUIT PACKAGE", having a serial number of 16/716,720, having a filing date of Dec. 17, 2019, having common inventors, and having a common assignee, all of which is incorporated by reference in its entirety.

BACKGROUND

Field

This disclosure relates generally to millimeter-wave (mmWave) integrated circuits (e.g., integrated circuits for automotive radar systems and high-speed communication systems), and more specifically, to incorporating a heat sink with a waveguide coupled to an antenna feed in a top surface of an integrated circuit package, thereby facilitating thermal management of integrated circuit device die within the package.

Related Art

Radar sensors and high frequency radio devices (e.g., 5G-NR and WiGig) play a significant role in development of automated and autonomous driving concepts and applications. These devices can require several antennas for transmitting and detecting signals, along with a high degree of signal sensitivity. The antennas and the associated semiconductor device packages can consume significant area on circuit boards. Automotive radar sensor and high-speed communication device usage is expected to continue to grow in the coming years, as is the need to reduce size and increase sensitivity of such integrated circuit devices.

Generating sufficient power to transmit and providing required sensitivity to detect signals of millimeter-wave (mmWave) systems is limited by various semiconductor device constraints, including available area and signal degradation over distance. In order to minimize power loss due to transmission lines from transmit and receive circuitry in a device die, a variety of techniques have been used to reduce the distance of the waveguide antennas from the circuitry. Historically, one or more waveguide antennas have been mounted on PCBs associated with the radar integrated circuits. Subsequently, the antenna feeds were moved closer to the circuitry by incorporating them on the periphery of the integrated circuit package.

With the antenna feeds on top of the integrated circuit package, radar/mmWave waveguides have also been moved to regions on top of the integrated circuit package. Doing so reduces a footprint of the package and waveguide assembly on the PCB, but prevents efficient heat removal from the integrated circuit die at the integrated circuit package top side, which can potentially damage the integrated circuit. It is therefore desirable to have a mechanism to remove heat from the integrated circuit device die by directing heat through a waveguide to a heatsink.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism to remove heat from an integrated circuit (IC) device die by directing heat through a waveguide to a heat sink. Embodiments provide the waveguide mounted on top of a package containing the IC device die. The waveguide is thermally coupled to the IC device die. The waveguide transports the heat to a heat sink coupled to the waveguide and located adjacent to the package on top of a printed circuit board on which the package is mounted. Embodiments provide both thermal dissipation of the generated heat while at the same time maintaining good radio frequency (RF) performance of the waveguide.

In order to minimize power loss due to transmission lines from transmit and receive circuitry in a RF semiconductor device die to associated antenna structures, a variety of techniques have been used to reduce distance between the antennas and the circuitry. Historically, waveguide antenna feeds were mounted on PCBs and the transmission lines were in both an integrated circuit (IC) mounted on the PCB as well as in the PCB. Then the antenna feeds were moved closer to the circuitry by incorporating them on the periphery of an integrated circuit package and mounting the waveguide antenna on both the package and the PCB on which the IC was mounted. Antenna feeds for the waveguide antennas have been moved even closer—by positioning the antenna feeds directly above the IC in the package—thereby minimizing a distance between transmission circuitry and the antenna structures.

While incorporating antenna feeds into IC packages improves performance of antenna to transmit/receive circuitry, the installation of waveguide antenna structures on top of the IC package introduces difficulties in removing heat from the IC device die within the package. Typically, heat is removed by a heat sink mounted on the IC package and thermally coupled to the device die. But if the waveguide antenna structure is mounted on the IC package, there is no room for the heat sink to be mounted there as well, without interfering with the antennas. Embodiments of the present invention provide a solution to this issue.

Figure 1:
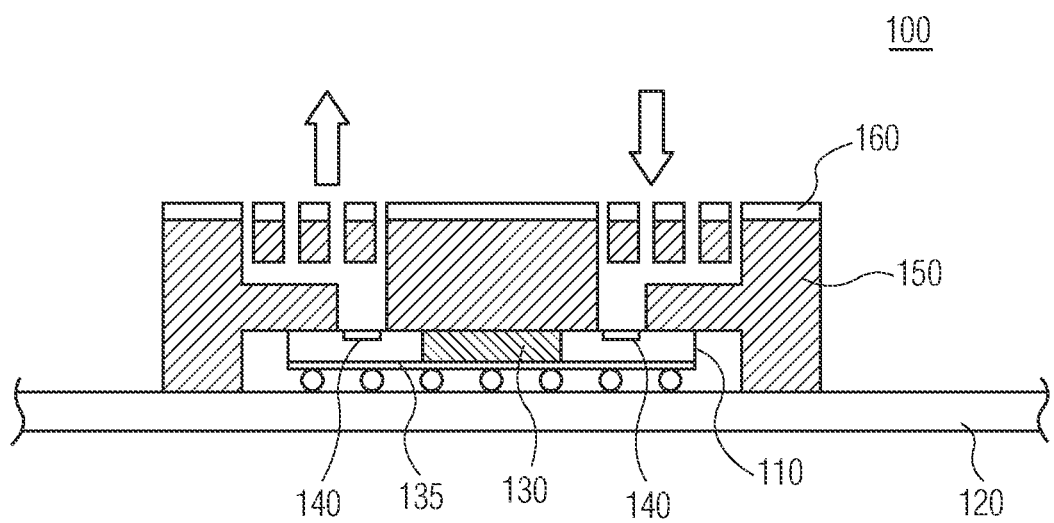
FIG. 1 is a simplified block diagram illustrating a cross-section of a high frequency RF semiconductor device that includes a semiconductor device package mounted on a printed circuit board (PCB) and having antenna feeds on the semiconductor device package with an associated waveguide structure mounted on the package.

FIG. 1 is a simplified block diagram illustrating an example of a cross-section of a high frequency RF semiconductor device 100 that includes a semiconductor package 110 mounted on a printed circuit board (PCB) 120 and having antenna feeds on the semiconductor device package with an associated waveguide structure mounted on the package. A semiconductor device die 130 is incorporated in semiconductor device package 110. Within semiconductor device package 110 are traces 135 coupling circuitry within semiconductor device die 130 to antenna feeds 140. Antenna feeds 140 are incorporated within semiconductor device package 110 to reduce distance from circuitry within the semiconductor device die and the antenna feeds. Antenna feeds 140 are associated with waveguide structure 150, which is associated with antenna arrays 160. The antenna feeds, waveguide structure, and antenna arrays can perform signal transmission and reception, as needed. Waveguide structure 150 is mounted on both semiconductor device package 110 and PCB 120, thereby covering the semiconductor device package.

While high-frequency RF semiconductor device 100 improves performance over previous such devices by reducing signal path length, the mounting of waveguide structure 150 over semiconductor device package 110, and specifically semiconductor device die 130, interferes with the ability to transport heat from the semiconductor device package. This, in turn, can limit operational parameters and ultimately damage the circuitry within the semiconductor device die.

Figure 2A:
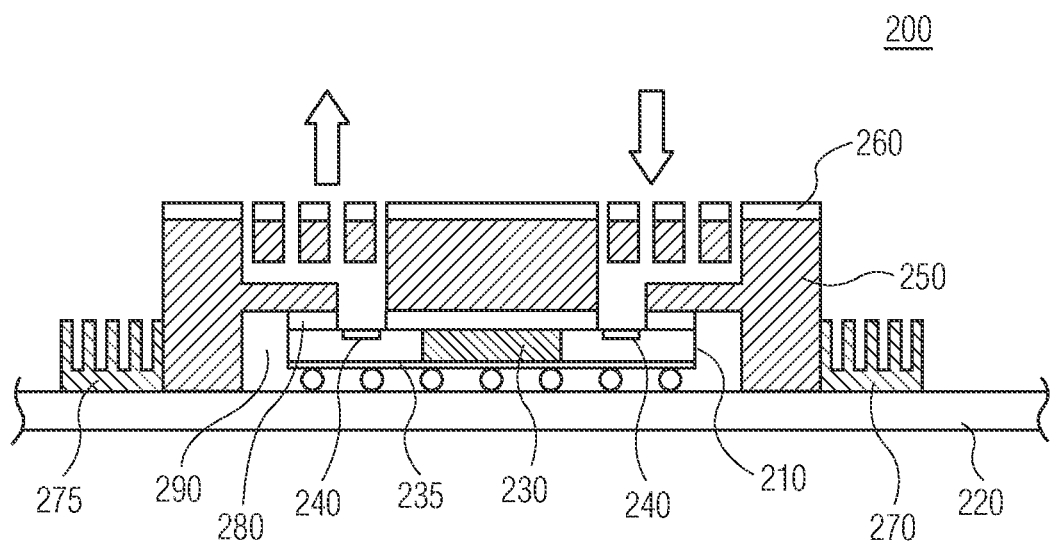
FIGS. 2A and 2B are simplified block diagrams illustrating a cross-section and plan view, respectively, of a high-frequency RF semiconductor device that provides heat dissipation from a semiconductor device die by incorporating a thermal coupling from the semiconductor device die to an assembly including both a waveguide structure and a heat sink structure, in accord with embodiments of the present invention.
Figure 2B:
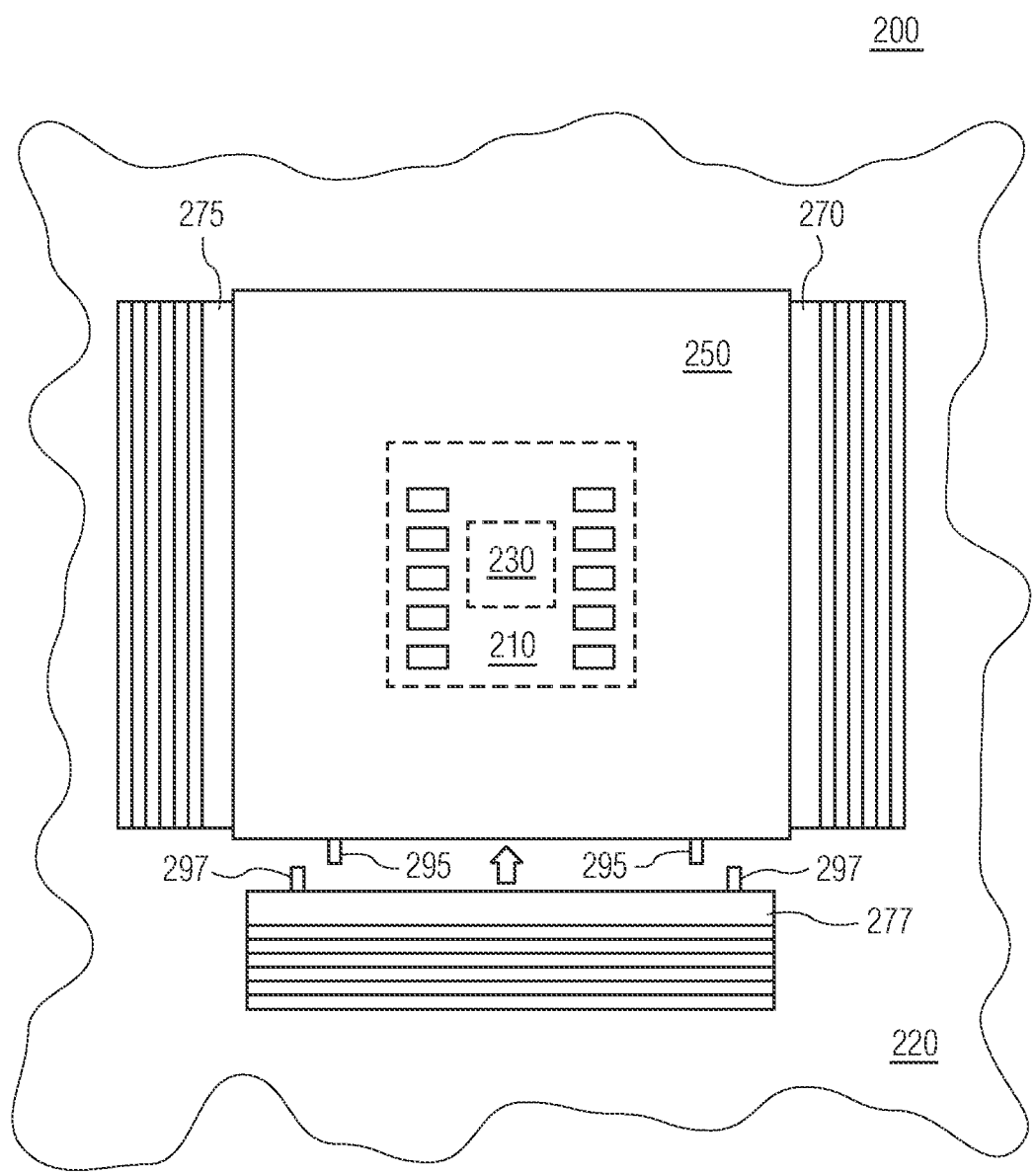

FIGS. 2A and 2B are simplified block diagrams illustrating a cross-section and plan view, respectively, of an example high-frequency RF semiconductor device 200 that provides heat dissipation from a semiconductor device die 230 by thermally coupling the semiconductor device die to an assembly that includes both a waveguide structure and a heat sink structure, in accord with embodiments of the present invention.

Semiconductor device die 230 is incorporated in semiconductor device package 210, which is mounted on PCB 220. As in FIG. 1, traces 235 couple antenna feed structures 240 to the semiconductor device die. FIG. 2A illustrates the antenna feed structures formed within a dielectric of the semiconductor device package and having an exposed surface. Alternatively, the antenna feed structures can be formed on a surface of the semiconductor device package. In addition, instead of being formed on the periphery of the semiconductor device package, the antenna feed structures can be formed in a region above semiconductor device die 230, thereby shortening the signal paths between the die and the antenna feeds even further. It should be noted that embodiments are not limited by the type of semiconductor device package format. Embodiments can include package types such as, for example, fanout wafer-level, flip chip—ball grid array, flip chip—chip scale package, or any other package that contains an RF die that allows heat dissipation from the topside.

A waveguide structure 250 is associated with antenna feed structures 240, and having associated antenna arrays 260. In order to dissipate heat from semiconductor device die 230, heat sink structures 270, 275, and 277 are coupled to the outer edges of waveguide structure 250. The heat sink structures can be thermally and mechanically coupled to the waveguide structure through the use of, for example, a thermally-conductive adhesive applied in the region between the heat sink structures and the waveguide structure, pins (e.g., pins 295 and 297), or screw-type connectors, or a combination thereof. Alternatively, the heat sink structures can be formed as part of the waveguide structure using a single piece of material. To further enhance heat transfer from the semiconductor device die to the waveguide/heat sink structures, thermal interface material 280 can be used to thermally couple the waveguide/heat sink structures to the top major surface of the semiconductor device package. The combined waveguide/heat sink structures are mounted on both semiconductor device package 210 (via thermal interface material 280) and PCB 220.

A major surface of semiconductor device die 230 can be exposed at the major surface of semiconductor device package 210 to further enhance thermal connectivity to the die. Alternatively, if the semiconductor device die is provided within the semiconductor device package such that a major surface of the semiconductor device die is not available at the top major surface of the semiconductor device package, thermal conduits or vias can be provided in the package to enhance thermal transfer from the die to the thermal interface material and the waveguide/heat sink structures.

In the embodiments shown herein, semiconductor device die 230 is a flip chip die, having an active side in a face-down orientation toward the bottom surface of the semiconductor device package being formed. The active side includes a plurality of die pads connected to active circuitry within the semiconductor device, where the perimeter die pads of semiconductor device die 230 are attached (e.g., mechanically attached and electrically connected) through traces to ball grid array (BGA) pads on the bottom-side major surface of the package. Signal pads can also be connected to a signal line of active circuitry that carries a radio frequency (RF) signal. Antenna feeds are coupled to RF circuitry and mounted on a major surface of the package opposite the surface having the BGA pads.

Semiconductor device die 230 can be singulated from a semiconductor wafer, which can be any semiconductor material or combinations of materials, such as gallium arsenide, silicon germanium, silicon-on-insulator (SOI), silicon, monocrystalline silicon, the like, and combinations of the above. Such a semiconductor die includes active circuitry, which may include integrated circuit components that are active when the die is powered. The active circuitry is formed on the semiconductor wafer using a sequence of numerous process steps applied to semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. In some embodiments, the active circuitry may be a combination of integrated circuit components or may be another type of microelectronic device. Examples of integrated circuit components include but are not limited to a processor, memory, logic, oscillator, analog circuitry, sensor, a standalone discrete device such as a resistor, inductor, capacitor, diode, power transistor, and the like.

It is noted that in the embodiments presently described, the active circuitry of semiconductor device die 230 includes a radio frequency (RF) block that implements an RF transmitter, an RF receiver, or both. In embodiments, RF signals are transmitted, received, or both, via an antenna on the resulting device (e.g., antenna array 260) that is communicatively coupled to the active circuitry of semiconductor device die 230 (e.g., through antenna feeds 240). The RF block may implement front end components of the RF transmitter, RF receiver, or both, where the front end components may include but are not limited to a transmitter power amplifier, a receiver low noise amplifier, one or more baluns, one or more filters, a circulator or other coupling device to the antenna, impedance matching elements, an oscillator, a phase locked loop, and other appropriate front end elements. The front end components of the RF block may have configurable settings to adjust the transmit signal or receive signal. In some embodiments, the RF block may have an operating frequency that falls within a frequency band of 76 GHz to 81 GHz, although other operating frequencies that fall within other radio frequencies may be implemented in other embodiments.

Heat sink structures 270, 275, and 277 can be formed of a thermally-conductive metal, such as, for example, aluminum, copper, titanium, or stainless steel, or a thermally-conductive non-metal, such as, for example, silicon carbide, thermally-conductive plastics, and the like. The heat sink structures can be formed in a number of configurations such as plain block, finned, and the like. In addition, heat sink structures can be formed using a variety of manufacturing methods, such as, for example, extruded, bonded, skived, stamped, forged, machined, cast, and printed depending upon the nature of the application. These alternative manufacturing methods are particularly applicable in instances where heat sink structures 270, 275, and 277 are manufactured separately from waveguide structure 250, providing greater flexibility in optimizing both heat transfer and performance of the wave guide. Further, the heat sink structures can be formed to radiate heat vertically, horizontally, at an angle, or radially, depending upon the nature of the application and the environment in which semiconductor device 200 is installed for operation.

In order to aid in the thermal conductivity of the combined waveguide/heat sink structures, waveguide structure 250 can also be formed of a thermally-conductive metal, which may be the same or different as that used for heat sink structures 270, 275, and 277, but which can be optimal for waveguide operations associated with the antenna structures. The through holes of the waveguide structures can be orthogonal to the horizontal surfaces or at an angle, depending upon the nature of the application. Further, the through holes can have different opening sizes at the top and bottom of the waveguide structure.

Thermal interconnect material (TIM) 280 can have a variety of characteristics, depending upon the nature of the application. The TIM can be made from, for example, an epoxy adhesive, an elastomer, a phase change material, or grease. If the TIM is made of an elastomer, for example, in addition to providing heat transfer between the semiconductor device package and the waveguide/heat sink structure, another advantage is that the TIM can compensate for assembly height tolerances between the semiconductor device package and the waveguide/heat sink. In addition, an elastomer TIM can decouple stress from the waveguide/heat sink structure and the package when both are mounted on the PCB (as opposed to a direct connection between the waveguide/heat sink structure and the package), which can improve package reliability. In such applications, the TIM can be between approximately 10 microns to 2 millimeters. Depending on the nature of the application, differing types of TIM materials can offer different mechanical attributes lending themselves toward stress decoupling. In some embodiments, the thermal conductivity of a TIM can be about 3 W/mK. In such embodiments, a reduction of heat experienced by the semiconductor device die can be about 25%-50% for the heat sink structures described herein.

Depending upon the nature of the application, and the selected material for the TIM, the TIM can be formed of a continuous sheet and placed between the waveguide/heat sink structure and the semiconductor device package, or the TIM can be formed with holes in regions either over antenna feeds 240 and holes in the waveguide, or alternatively with holes over the die itself, allowing for direct contact with the die or alternative materials to conduct heat. The TIM is ideally thermally and electrically conductive, but certain applications may require the TIM to be only thermally conductive, or certain sections of the time to be thermally conductive, electrically conductive, or both. For example, if the TIM is electrically conductive, then holes in the TIM will be needed for regions where electrical conductivity is not desirable. Thickness of an electrically conductive TIM can range for a few microns to several millimeters. If the TIM is not electrically conductive, then holes would not be necessary, unless desirable for other reasons. The TIM thickness, for a non-conductive material, can range from a few microns to not more than between 100-200 microns, depending upon desired electromagnetic performance for the specific application (e.g., different operative frequencies can impact TIM thickness to provide comparable RF performance; higher frequencies can require a thinner TIM).

For either electrically-conductive or not electrically conductive TIM, due to the placement in the device, the TIM is exposed to an electromagnetic field at the RF working frequency of the semiconductor device. Electromagnetic properties of the TIM (e.g., relative dielectric permittivity, dielectric tangent loss, or conductivity at the RF working frequency) and thickness will have an impact on coupling of the electromagnetic field in the waveguide with the antenna feed. This coupling can be quantified by parameters such as impedance matching at the ports of the antenna feed transition (e.g., package-TIM-waveguide), insertion loss at the ports of the antenna feed transition, and isolation among the ports of the antenna feed transition. Further, for a TIM having holes, the dimensions of the holes can have an impact on the electromagnetic field coupling.

As illustrated, semiconductor device package 210 is located in a cavity 290 formed by waveguide structure 250. Embodiments of the present invention are not limited to one semiconductor device package within cavity 290 or one semiconductor device die 230 within a semiconductor device package. Multiple semiconductor device packages can be mounted on PCB 220 and located within waveguide cavity 290, such that the waveguide/heat sink structure can dissipate heat from each of the semiconductor device packages. Further, multiple semiconductor device dies can be present within each semiconductor device package, such that the waveguide/heat sink structure can dissipate heat from each of the semiconductor device die.

As illustrated, semiconductor device package 210 includes antenna feeds 240 on a topside major surface of the package, while the bottom-side major surface of the package faces PCB 220. This provides for waveguide structure 250 to be placed on the topside major surface of the package and the surface of the PCB on which the package is mounted. This further allows for other components to be placed on the opposing side of the PCB without regard to antenna placement (e.g., as in cases where a package has antenna feeds that radiate through a hole in the PCB).

Figure 3:
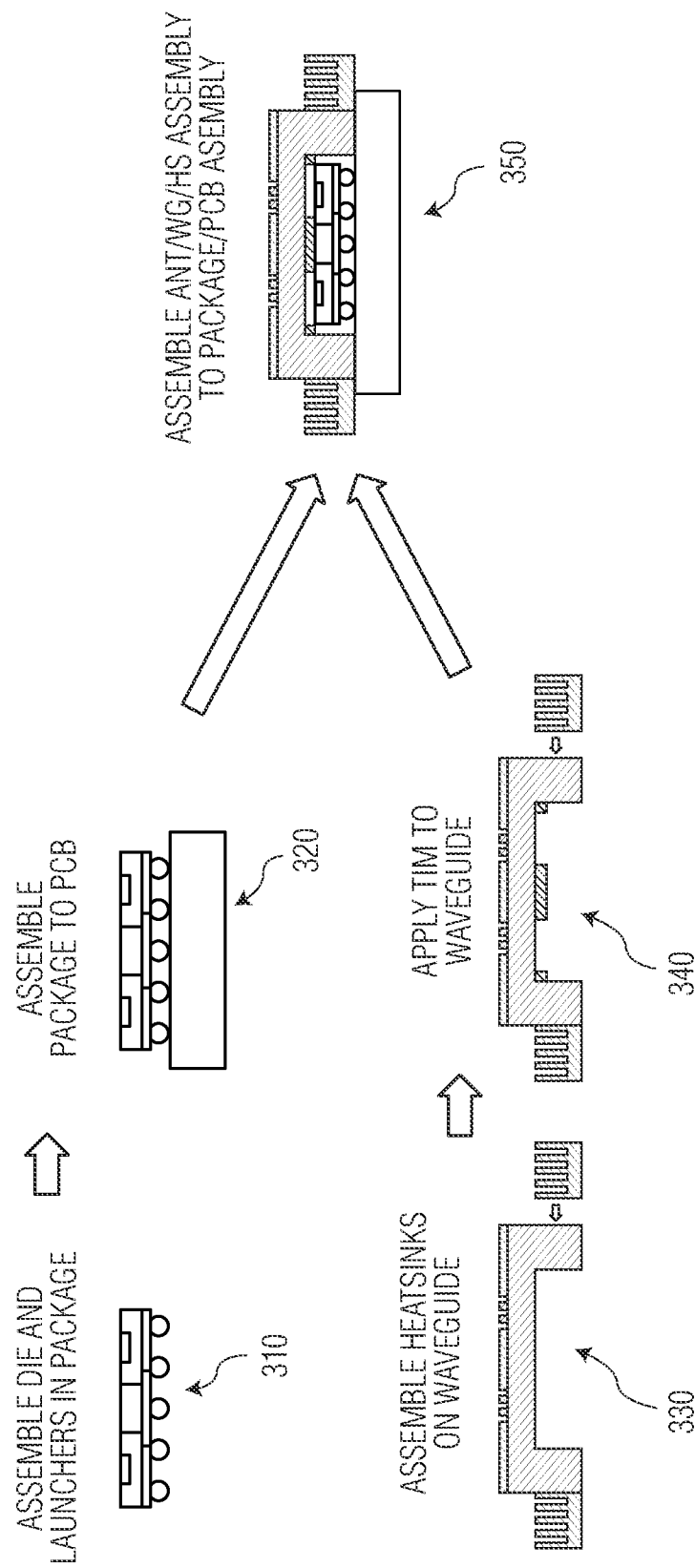
FIG. 3 is a simplified block diagram illustrating an example of an assembly flow for embodiments of the present invention.

FIG. 3 is a simplified block diagram illustrating an example of an assembly flow for embodiments of the present invention. In this example, the semiconductor device package (e.g., semiconductor device package 210) is assembled with antenna feeds placed on a topside major surface of the package, while low-frequency signal contacts are placed on the bottom-side major surface of the package (310). As discussed above, a semiconductor device die within the semiconductor device package can either have an exposed major surface at the topside major surface of the package or thermal conduits or thermal vias formed within the semiconductor device package to thermally couple the semiconductor device die to the topside major surface of the semiconductor device package. The semiconductor device package is then assembled to a PCB having communication traces corresponding to the signal contacts (320). Such assembly can include soldering or solder reflow operations known in the art. Alternatively, a semiconductor device package can have signal contacts on the topside major surface with wirebonding to signal contacts on the PCB.

While the semiconductor device package is being assembled, the waveguide/heat sink structures can be formed and assembled together (330). As discussed above, the waveguide and the heat sink structures can be formed of a thermally conductive material such as metals. Though both structures need not be assembled of the same material. Further, the heat sinks can be formed to have a variety of heat dissipating characteristics, as discussed above. The heat sink structures are attached to the waveguide structure in a manner to facilitate thermal transfer between the structures. Attachment mechanisms can include a thermally-conductive adhesive, or a mechanical coupling including pins or screws, or a combination of these methods. Alternatively, the waveguide structure and the heat sink structure can be formed as a single unit such that no coupling between the waveguide and the heat sink need be performed.

Once the waveguide/heat sink structure is formed or assembled, a thermal interface material (e.g., TIM 280) can be applied to surfaces of the waveguide/heat sink structure that will come in contact with portions of the semiconductor device package (340). Alternatively, the TIM can be applied to the top of the semiconductor device package, depending on which method eases alignment of the TIM material with the antenna feed structures and waveguide openings, for example. If the TIM has openings that correspond to the openings in the waveguide structure, then the openings are aligned at this time. Once the semiconductor device package/PCB assembly and the waveguide/heat sink structure assembly has been completed, the waveguide/heat sink structures can be assembled to the semiconductor device package/PCB assembly (350). The TIM can function as an adhesive for the waveguide portion of the assembly to the semiconductor device package, depending on the nature of the TIM material (e.g., an epoxy). If desired or indicated by the application, the heat sink portion of the structure can be adhesively coupled to the PCB.

As discussed above, embodiments of the present invention provide a mechanism to transport heat from a semiconductor device package to a heat sink attached to a waveguide mounted on the top surface of the package. The heat sinks are attached on a side surface of the waveguide such that antenna structures are not interfered with by the heat sinks. Multiple packages and die can be thermally coupled to the waveguide to allow for heat dissipation by the heat sinks.

By now it should be appreciated that there has been provided a semiconductor device that includes a semiconductor device package including a semiconductor device die and one or more antenna feeds on a topside major surface of the semiconductor device package, a waveguide mounted on the topside surface of the semiconductor device package and communicatively coupled to the one or more antenna feeds, a heat sink coupled to a side of the waveguide and thermally coupled to the semiconductor device die through the waveguide, and a printed circuit board (PCB). The semiconductor device package is mounted on a first surface of the PCB at a bottom side major surface of the semiconductor device package, and the waveguide and the heat sink are mounted on the first surface of the PCB.

In one aspect of the above embodiment the semiconductor device further includes a thermal interface material configured to mechanically, thermally, and electromagnetically couple the waveguide to the semiconductor device die. In a further aspect, the thermal interface material includes an elastomer configured to mechanically isolate the waveguide from the semiconductor device package. In another further aspect, the thermal interface material includes a material that is electrically conductive. In another aspect, the waveguide includes one or more through holes in regions above the antenna feeds and the thermal interface material includes one or more holes in regions between the antenna feeds and the waveguide through holes. In still another aspect, the waveguide includes one or more through holes in regions above the antenna feeds and the thermal interface material is a solid sheet of material. In yet another aspect, the waveguide includes one or more through holes in regions above the antenna feeds and the thermal interface material includes a first type of material in regions proximate to the antenna feeds and the waveguide through holes and a second type of material in regions not proximate to the antenna feeds and the waveguide through holes.

In another aspect of the above embodiment, the waveguide includes a cavity in which the semiconductor device package is coupled to the waveguide. In yet another aspect, the waveguide includes a rectangular footprint surrounding the semiconductor device package and the heat sink is mounted to one or more perimeter sides of the waveguide. In still another aspect, the heat sink includes radiator fins configured to dissipate heat from the semiconductor device die. In another aspect, the waveguide and the heat sink are formed from a single piece of material. In yet another aspect, the waveguide includes one or more of aluminum, copper, stainless steel, and a thermally conductive material. In still another aspect, the heat sink includes one or more of aluminum, copper, stainless steel, and a thermally conductive material.

Another embodiment of the present invention provides a RF semiconductor device heat-sinking waveguide that includes a waveguide portion and a heat sink portion. The waveguide portion is configured to mount to a top major surface of a semiconductor device package having one or more antenna feeds on the top major surface. The waveguide portion includes through holes corresponding to the one or more antenna feeds and one or more antenna arrays corresponding to the one or more antenna feeds. The heat sink portion is thermally coupled, via the waveguide portion, to a semiconductor device die included in the semiconductor device package. The heat sink portion is coupled to a side surface of the waveguide portion on a region of the waveguide portion clear of the one or more antenna arrays. The heat sink portion is configured to radiate heat from the semiconductor device die.

In one aspect of the above embodiment, the waveguide portion and the heat sink portion are formed from a single piece of material. In another aspect of the above embodiment, the heat sink portion is mechanically and thermally attached to the waveguide portion by one or more fasteners. In still another aspect, the heat sink portion is mechanically and thermally attached by a thermal adhesive. In still another aspect, the waveguide portion is configured to be attached to the semiconductor device package by a thermal interface material. In a further aspect, at least a portion of the thermal interface material is thermally, electrically, and electromagnetically conductive. In another aspect, the waveguide portion includes a cavity configured to contain the semiconductor device package mounted on a first surface of a printed circuit board (PCB) and the waveguide portion is further configured to be mounted on the first surface of the PCB when attached to the semiconductor device package.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, differing materials and methods of manufacture of the heat sinks can be utilized. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A RF semiconductor device heat-sinking waveguide comprising:
    a waveguide portion, configured to mount to a top major surface of a semiconductor device package having one or more antenna feeds on the top major surface, and comprising
        through holes corresponding to the one or more antenna feeds, and
        one or more antenna arrays corresponding to the one or more antenna feeds; and
    a heat sink portion, wherein
        the heat sink portion is thermally coupled, via the waveguide portion, to a semiconductor device die comprised in the semiconductor device package,
        the heat sink portion is coupled to a side surface of the waveguide portion on a region of the waveguide portion clear of the one or more antenna arrays, and
        the heat sink portion is configured to radiate heat from the semiconductor device die.

2. The heat-sinking waveguide of claim 1 wherein the waveguide portion and heat sink portion are formed from a single piece of material.

3. The heat-sinking waveguide of claim 1 wherein the heat sink portion is mechanically and thermally attached to the waveguide portion by one or more fasteners.

4. The heat-sinking waveguide of claim 1 wherein the heat sink portion is mechanically and thermally attached by a thermal adhesive.

5. The heat-sinking waveguide of claim 1 wherein the waveguide portion is configured to be attached to the semiconductor device package by a thermal interface material.

6. The heat-sinking waveguide of claim 5 wherein at least a portion of the thermal interface material is thermally and electrically conductive.

7. The heat-sinking waveguide of claim 1 wherein
    the waveguide portion comprises a cavity configured to contain the semiconductor device package mounted on a first surface of a printed circuit board (PCB), and
    the waveguide portion is further configured to be mounted on the first surface of the PCB when attached to the semiconductor device package.

8. A RF semiconductor device heat-sinking waveguide comprising:
    a waveguide portion, configured to mount to a top major surface of a semiconductor device package having one or more antenna feeds on the top major surface, and comprising:
        through holes corresponding to the one or more antenna feeds, and one or more antenna arrays corresponding to the one or more antenna feeds,
        wherein the semiconductor device package is mounted on a first surface of a printed circuit board (PCB) and the waveguide portion is further configured to mount to the first surface of the PCB; and
    a heat sink portion, wherein:
        the heat sink portion is thermally coupled, via the waveguide portion, to a semiconductor device die comprised in the semiconductor device package,
        the heat sink portion is coupled to a side surface of the waveguide portion on a region of the waveguide portion clear of the one or more antenna arrays, and
        the heat sink portion is configured to radiate heat from the semiconductor device die.

9. The heat-sinking waveguide of claim 8 wherein the waveguide portion and heat sink portion are formed from a single piece of material.

10. The heat-sinking waveguide of claim 8 wherein the heat sink portion is mechanically and thermally attached to the waveguide portion by one or more fasteners.

11. The heat-sinking waveguide of claim 8 wherein the heat sink portion is mechanically and thermally attached by a thermal adhesive.

12. The heat-sinking waveguide of claim 8 wherein the waveguide portion is configured to be attached to the semiconductor device package by a thermal interface material.

13. The heat-sinking waveguide of claim 12 wherein at least a portion of the thermal interface material is thermally and electrically conductive.

14. The heat-sinking waveguide of claim 8 wherein the waveguide portion comprises a cavity configured to contain the semiconductor device package mounted on the first surface of the PCB.

15. A RF semiconductor device heat-sinking waveguide comprising:
- a waveguide portion, configured to mount to a top major surface of a semiconductor device package having one or more antenna feeds on the top major surface, and comprising:
  - through holes corresponding to the one or more antenna feeds, and one or more antenna arrays corresponding to the one or more antenna feeds,
  - wherein the semiconductor device package is mounted on a first surface of a printed circuit board (PCB) and the waveguide portion is further configured to mount to the first surface of the PCB; and
- a heat sink portion, wherein:
  - the heat sink portion is coupled, via the waveguide portion, to a semiconductor device die comprised in the semiconductor device package by way of a thermal interface material (TIM) comprising an elastomer,
  - the heat sink portion is coupled to a side surface of the waveguide portion on a region of the waveguide portion clear of the one or more antenna arrays, and
  - the heat sink portion is configured to radiate heat from the semiconductor device die.

16. The heat-sinking waveguide of claim 15 wherein the waveguide portion and heat sink portion are formed from a single piece of material.

17. The heat-sinking waveguide of claim 15 wherein the heat sink portion is mechanically and thermally attached to the waveguide portion by one or more fasteners.

18. The heat-sinking waveguide of claim 15 wherein the heat sink portion is mechanically and thermally attached by a thermal adhesive.

19. The heat-sinking waveguide of claim 15 wherein at least a portion of the TIM is thermally and electrically conductive.

20. The heat-sinking waveguide of claim 15 wherein the waveguide portion comprises a cavity configured to contain the semiconductor device package mounted on the first surface of the PCB.

* * * * *